US 6,614,086 B2

(12) United States Patent
Kim et al.

(10) Patent No.: US 6,614,086 B2
(45) Date of Patent: Sep. 2, 2003

(54) AVALANCHE PHOTODETECTOR

(75) Inventors: Gyung Ock Kim, Seoul (KR); In Kyu Kim, Daejon (KR); Kwang Eui Pyun, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 09/927,312

(22) Filed: Aug. 13, 2001

(65) Prior Publication Data

US 2002/0074555 A1 Jun. 20, 2002

(30) Foreign Application Priority Data

Dec. 19, 2000 (KR) .......................... 2000-78261

(51) Int. Cl.[7] ............................. H01L 31/107
(52) U.S. Cl. ................. 257/438; 257/21; 257/186; 257/187
(58) Field of Search ................. 257/438, 186, 257/187, 21

(56) References Cited

U.S. PATENT DOCUMENTS

| 5,389,797 A | * | 2/1995 | Bryan et al. ............... 257/186 |
| 5,457,327 A | | 10/1995 | Taguchi |
| 5,539,221 A | | 7/1996 | Tsuji et al. |
| 5,977,557 A | * | 11/1999 | Kim ........................... 257/21 |
| 6,184,538 B1 | * | 2/2001 | Bandara et al. .......... 250/338.4 |

OTHER PUBLICATIONS

Watanabe, et al.; *Gain–Bandwith Product Analysis of InAl-GaAs–InAlAs Superlattice Avalanche Photodiodes;* IEEE Photonics Technology Letters, vol. 8, No. 2, Feb. 1996, pp. 269–271.

* cited by examiner

Primary Examiner—Jerome Jackson

(57) ABSTRACT

There is disclosed a photodetector having two or more avalanche-gain layered structures and multi-terminals. The avalanche photodetector includes an emitter light absorption layer structure located between a collector layer and an emitter layer (top contact layer) stacked on a substrate. The photodetector further comprises multiple avalanche-gain layered structures consisting of a charge layer, a multiplication layer and a contact layer between the light absorption layer and said collector layer.

18 Claims, 11 Drawing Sheets

M1(or M2)-1

M1(or M2)-2

M1(or M2)-1

M1(or M2)-2

(I)

(II)

(I)

(II)

(III)

(sq-a)

(sq-b)

AVALANCHE PHOTODETECTOR

TECHNICAL FIELD

The invention relates generally to a photodetector, and more particularly to a photodetector including two or more avalanche-gain layered structures and multi-terminals.

BACKGROUND OF THE INVENTION

Recently, research has been actively conducted for light reception (detection) devices that are used in ultra-high speed large-capacity optical communication systems, image processing systems, etc. The major objects of the developments were to enhance the speed and sensitivity of such devices. During recent years, along with the advancement of the semiconductor fabricating technologies such as molecular beam epitaxy (MBE), metal organic chemical vapor deposition (MOCVD), etc., semiconductor photoelectric devices having heterostructures have been developed.

Research into a bulk layer and a thin film thinner than 1000 Å of the materials such as GaSb/InAs, InAs/ZnTe, GaAs/Al(Ga)As, InGaAs/InAlAs/InP, etc. has been actively conducted using the energy bandgap engineering of the semiconductor heterostructure.

Also, research has been conducted regarding the phenomenon whereby light in the infrared-ray region is absorbed or emitted by the interband transition of electrons or the electron intersubband transition between quantum-confined states with a view to solving these technical problems.

In addition, studies on the absorption, generation and voltage-controlled tunability of infrared-ray, and high-speed performance of photodetecting devices have been actively undertaken. The applications of these technologies in the field of ultra-high speed light receivers, ultra-high speed switching devices and logic devices have technical importance.

Of the photodetectors that have been developed to solve these technical problems, the avalanche photodetector is advantageous due to its high sensitivity as compared to conventional PIN photodetectors. The avalanche photodetector, however, has the problems of requiring a very high voltage to obtain avalanche-gain, as well as having low speed and stability.

Conventional technologies concerning the avalanche photodetector may be briefly summarized as follows.

First, U.S. Pat. No. 5,539,221 issued to M. Tsuji and titled "Staircase Avalanche Photodiode" describes an electronic apparatus using the infrared-ray absorption effect of the semiconductor hetero-junction structure. The '221 patent describes the operational principle of the photodetector, and its applications and improved characteristics.

The '221 patent discloses a step-type avalanche photodetector including a periodic multi-layer structure graded into InGa(x)Al(1−x)As(x>0.1) from InAlAs in order to improve the dark current characteristic. In other words, in case of an avalanche photodiode having separated light absorption layers and a multiplication layer, it must have an electric field relaxation layer having a greater energy band gap than the light absorption layer and also have a triple structure in which a heavily doped layer is sandwiched between lightly doped layers. The patent discloses a triple-structure layer comprising a multiplication layer including a periodic multilayer graded into InGa(x)Al(1−x)As(x>0.1) from n⁻-InAlAs on a n-type InP substrate, a p⁻-InGaAs light absorption layer and a n-, p⁺, p⁻ type InP relaxation layer located between the light absorption layer and the multiplication layer. Utilizing this structure, the technology of the '221 patent improves the dark current characteristic.

Also, U.S. Pat. No. 5,457,327 issued to 'K. Taguchi' and entitled "Avalanche Photodiode with an improved multiplication layer" describes the operational principle of an photodetector, its application and improved characteristics.

The '327 patent teaches a photodetector structure including a light absorption layer, an electric field relaxation layer and a multiplication layer, wherein the multiplication layer has a structure periodically laminating two different layers in order to improve the operation speed. In the structure, the energy band gap of the first type layer gradually increases toward the direction in which accelerated electrons are moving and the energy band gap of the second type layer gradually reduces toward the direction in which accelerated electrons are moving. By means of the structure, the '327 patent improves the operation speed of the device.

SUMMARY OF THE INVENTION

The present invention is directed to solving the above problems and an object of the present invention is to provide an improved photodetector including a light absorption layer for detecting an infrared-ray being comprised of a single bulk-type material layer, a thin film layer, a quantum dots or quantum wires; more than two avalanche-gain layered structures each including a thin multiplication layer; and multi-terminals. The device of the present invention can obtain a high gain by applying a relatively low voltage, increase the sensitivity, provide multiple new functionalities due to the increased number of terminals and increase the stability of the device.

In order to accomplish the above objects, according to one aspect of the present invention, an avalanche photodetector is provided that includes an emitter light absorption layer located between a collector layer and an emitter layer (top contact layer) sequentially formed on a substrate, a plurality of avalanche-gain layered structures including a multiplication layer, a charge layer which controls the built-in potential and the electric field of the multiplication layer, and a contact layer located between the emitter light absorption layer and the collector layer.

According to another aspect of the invention, an avalanche photodetector is provided including an emitter light absorption layer structure located between a collector layer and an emitter layer (top contact layer) sequentially formed on a substrate, comprising a first avalanche-gain layered structure including a first multiplication layer formed on the collector layer, a first charge layer formed on the first multiplication layer and a contact layer formed on the first charge layer; and a second avalanche-gain layered structure including a second multiplication layer formed on the first avalanche-gain layered structure and a second charge layer formed on the second multiplication layer, wherein the emitter light absorption layer is stacked on the second avalanche-gain layered structure.

Further, according to still another aspect of the invention, a resonant cavity avalanche photodetector is provided including an emitter light absorption layer between a collector layer and an emitter layer (top contact layer) sequentially formed on a substrate, an underlying mirror structure formed between the substrate and the collector, an upper mirror structure formed on the emitter layer (top contact layer), a plurality of avalanche-gain layered structures including a charge layer, a multiplication layer and a contact layer between the light absorption layer and the collector layer.

BRIEF DESCRIPTION OF THE DRAWINGS

The aforementioned aspects and other features of the present invention will be explained in the following description, taken in conjunction with the accompanying drawings, wherein:

FIG. 6a and FIG. 6b are the energy band diagrams showing the energy states of respective layers in a three-terminal photodetector having two avalanche-gain layered structures shown in FIG. 1, wherein FIG. 6a shows an energy band diagram when voltage is not applied (i.e., thermal equilibrium state) and FIG. 6b shows an energy band diagram when an external voltage is applied thereto;

FIG. 7a and FIG. 7b are the energy band diagrams showing the energy states of respective layers in a three-terminal photodetector having three avalanche-gain layered structures shown in FIG. 2, wherein FIG. 7a shows an energy band diagram when voltage is not applied (i.e., thermal equilibrium state) and FIG. 7b shows an energy band diagram when an external voltage is applied thereto;

FIG. 8a and FIG. 8b are the energy band diagrams showing the energy states of respective layers in a planar type three-terminal avalanche photodetector having two avalanche-gain layered structures shown in FIG. 3, wherein FIG. 8a shows an energy band diagram when voltage is not applied (i.e., thermal equilibrium state) and FIG. 8b shows an energy band diagram when an external voltage is applied thereto; and, FIG. 9a and FIG. 9b are the energy band diagrams showing the energy states of respective layers in the resonant-cavity multiple-avalanche process four-terminal photodetector using intersubband transition of electrons and having three avalanche-gain layered structures shown in FIG. 4, wherein

DETAILED DESCRIPTION OF THE INVENTION

Figure 1:
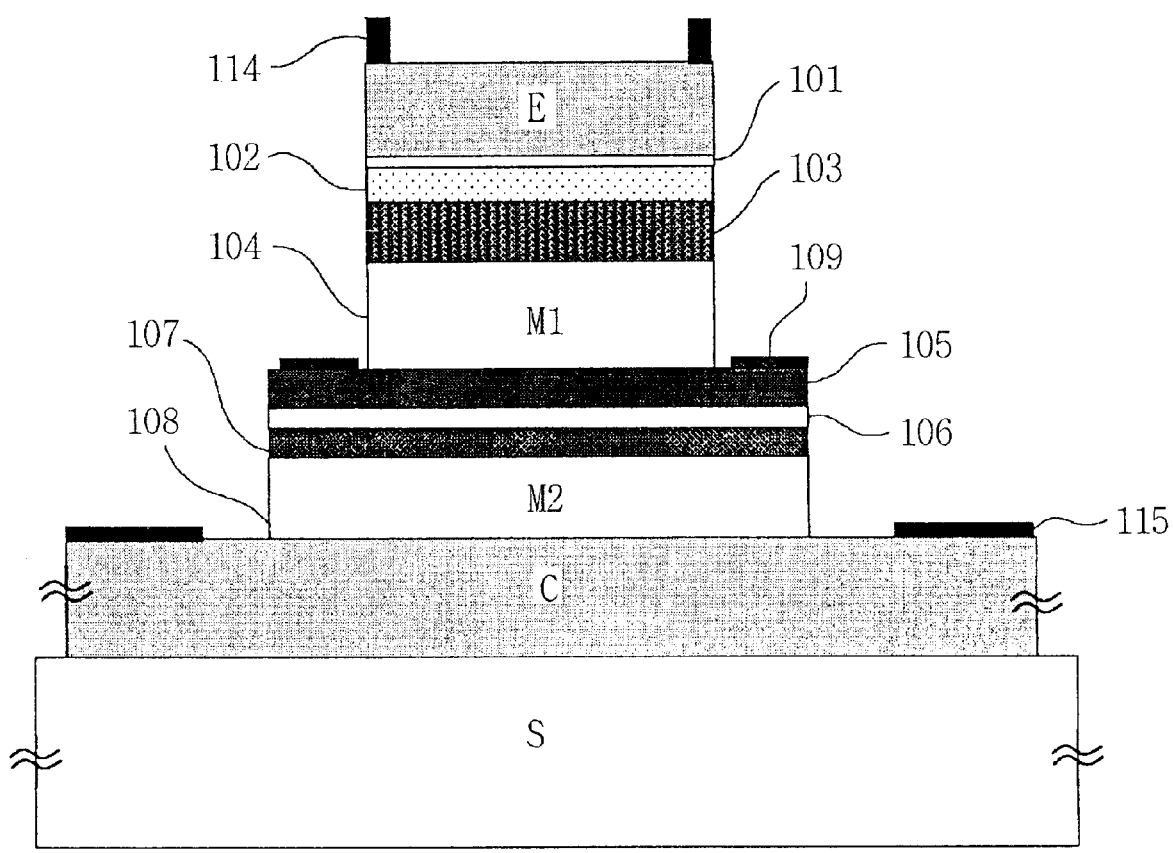
FIG. 1 is a lateral cross-sectional view of a low-voltage high-gain three-terminal photodetector according to a first embodiment of the present invention.
Figure 1:
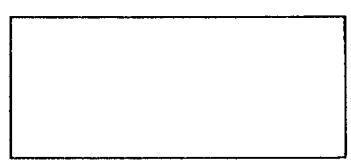
Figure 1:
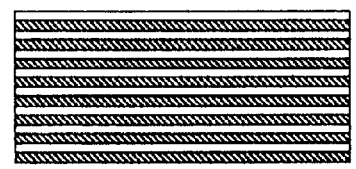

The present invention will be described in detail by way of a preferred embodiment with reference to accompanying drawings, in which like reference numerals are used to identify the same or similar parts.

It is generally known that a thin multiplication layer can improve the speed and noise characteristic of a photodetector. The present invention uses two or more avalanche-gain layered structures including a thin multiplication layer and multi-terminals. Thus, the present invention can accomplish low operating voltage, high gain, high sensitivity, high speed, stability, etc. due to the multiple avalanche process, and can select and process infrared-ray signals in various frequency bands since it can freely select the structure of the light absorption layer.

A photodetector proposed by the present invention can be used for various applications requiring very high sensitivity such as long-distance communication, single photon counting and compensation of low light absorption rate. Also, as the photodetector according to the present invention uses low voltage, it can be operated with low power. Further, the present invention can enhance the stability of the device since it can increase the gain of the device with the lower avalanche breakdown voltage. Thus, the device of the present invention can perform the function of a preamplifier and it can be applied to a high-speed photodetector, a high-speed infrared-ray signal detector/amplifier and a photo receiver. In addition, the present invention can be used in ultra-high speed switching and digital logics, high-speed infrared-ray logic devices having new and multiple functions due to its increased degree of freedom secured by its multi-terminal operation.

In order to accomplish the above object, the device according to the present comprises an emitter layer (top contact layer) and a collector layer of a conductive type, a light absorption layer located between the emitter and the collector. The light absorption layer may be constructed with a single bulk-type material layer, a material film thinner than 1000 Å, a self-assembled quantum dot structure layer, and a vertical-type quantum dot array structure or quantum wire array structure formed with double (multiple) barrier quantum-well structure. Then, two or more avalanche-gain layered structures each comprising a charge layer, a multiplication layer, an electrode contact are formed thereon.

If an infrared-ray is incident on a photodetector thus constructed, interband transition or intersubband transition of electrons occurs in the light absorption layer. Also, if an external voltage is applied, electrons (or holes) generated by the absorption of light may be amplified through the charge layer and the multiplication layer, etc., to provide an amplified electrical signal. In each of the avalanche-gain layered structures, when a voltage is applied to the contact layer adjacent to the relatively thin (approximately below 5000 Å) multiplication layer, carriers generate a series of avalanche multiplication passing through the multiplication layers. As a result, a very high gain can be obtained. In other words, a high gain may be obtained by applying relatively low voltages to respective multiplication layers. The control of the avalanche-gain layered structure, that is, the impurity doping concentration, width, the intensity of applied electric field in the charge layer, the multiplication layer and the contact layer significantly affect the performance such as the gain, operation speed of the device. Therefore, the present invention can contribute to solve the problem of conventional avalanche photodetector that a very high voltage should be applied to the single multiplication layer in order to obtain a high gain. Accordingly, the present invention also solves the problem of the breakdown of the device caused by the application of high voltage.

According to the operational wavelength and the application of the device, the emitter light absorption layer for an infrared-ray detector may be constructed with a single bulk-type material layer, a material film thinner than 1000 Å, a vertical-type quantum dot or quantum wire array structure formed with a epitaxial layered structure of ultra-thin quantum well, or a self-assembled quantum dot assembly structure. In addition, a spacer layer for controlling the impurity diffusion may be added to the light absorption layer.

Referring now to FIG. 1, a structure of a low-voltage high-gain three-terminal photodetector according to a first embodiment of the present invention will be below explained in detail.

The photodetector shown in FIG. 1 includes two avalanche-gain layered structures consisting of multiplication layers 104 and 108, charge layers 103 and 107, and a contact layer 105, between the emitter light absorption layer 102 and the collector layer C. (The collector layer corresponds to the contact layer next to the multiplication layer M2) Meanwhile, reference numerals 114, 109 and 115 indicate elements functioning as electrodes. Also, the spacer layers 101 and 106 function to control the impurity diffusion.

The multiplication layers 104 and 108 may employ a single bulk-type layer or a superlattice, which has a larger energy bandgap than that of the emitter light absorption layer 102. In addition, the emitter light absorption layer 102 may be formed by using one of a single bulk-type material layer, a thin material film thinner than 1000 Å, a self-assembled quantum dot assembly structure layer, a vertical-type quantum dot array or quantum wire array structure formed using quantum-well structures. For example, the photodector may be obtained by sequentially forming a p$^+$-InAlAs emitter layer (top contact layer), an i-InAlAs spacer layer, an i-InGaAs single material light absorption layer thinner than 1 $\mu$m and an avalanche-gain layered structure (consisting of a p-InAlAs charge layer thinner than 1000 Å, an i-InAlAs multiplication layer thinner than 5000 Å and a n$^+$ contact layer thinner than 2000~3000Å).

Figure 2:
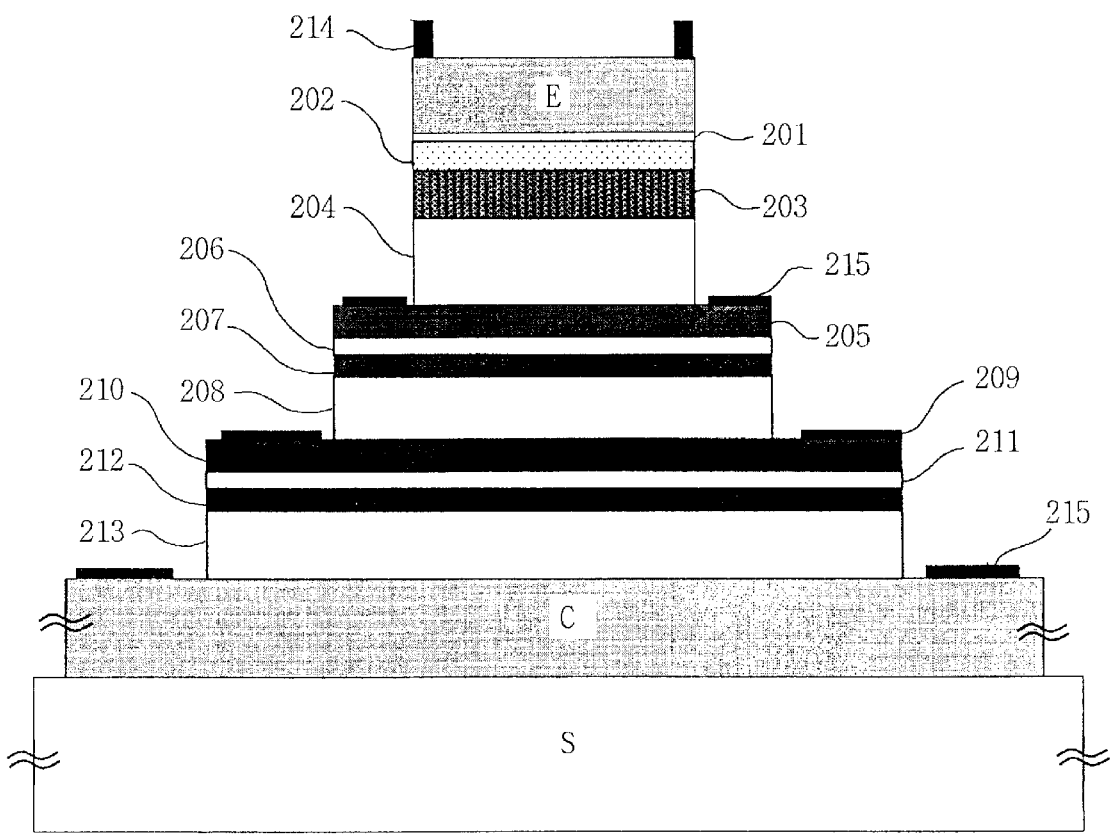
FIG. 2 is a lateral cross-sectional view of a low-voltage high-gain four-terminal photodetector according to a second embodiment of the present invention.

Referring now to FIG. 2, a structure of a low-voltage high-gain four-terminal photodetector according to a second embodiment of the present invention will be below explained in detail.

The photodetector shown in FIG. 2 includes three avalanche-gain layered structures consisting of a first charge layer 212, a second charge layer 207, and a third charge layer 203, a first multiplication layer 213, a second multiplication layer 208, and a third multiplication layer 204, and contact layers 205 and 210 between the emitter light absorption layer 202 and the collector layer C. The emitter light absorption layer 202 may be formed by using one of a bulk-type layer, a self-assembled quantum dot structure, a vertical-type quantum dot array or quantum wire array structure formed by using a quantum well structure.

Figure 3:
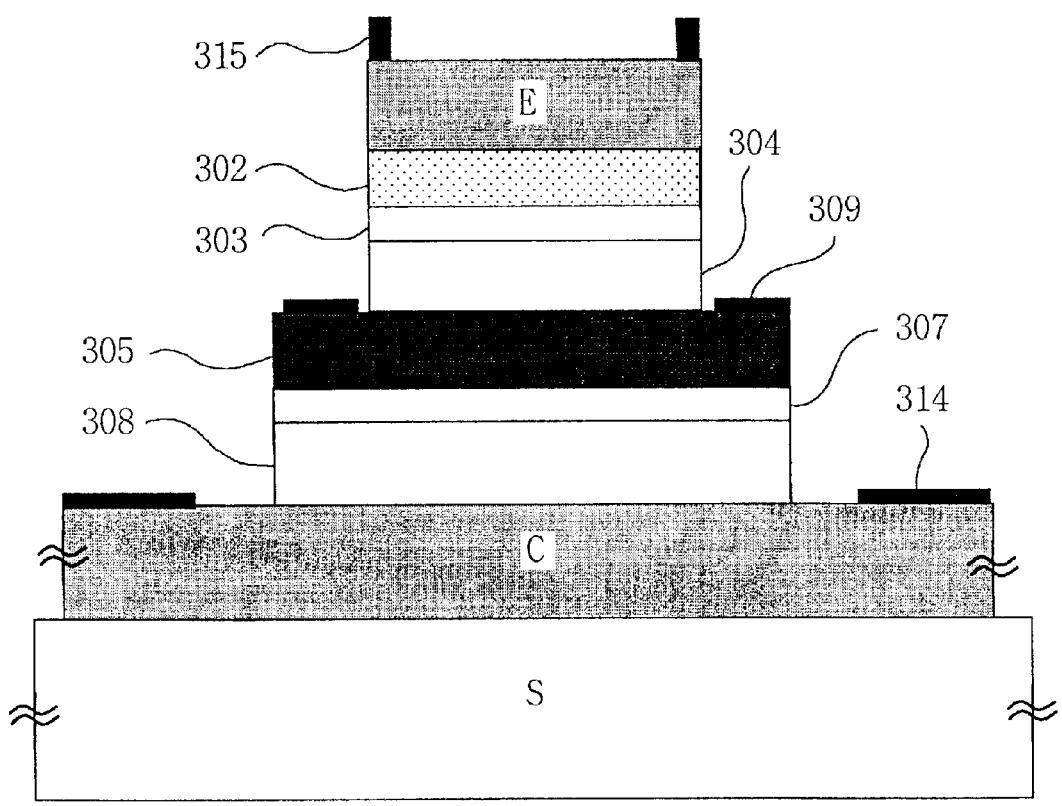
FIG. 3 is a lateral cross-sectional view of a planar-type three-terminal avalanche photodetector using holes according to a third embodiment of the present invention.

Referring now to FIG. 3, a structure of a planar three-terminal avalanche photodetector using holes according to a third embodiment of the present invention will be below explained in detail. The photodetector shown in FIG. 3 includes two avalanche-gain layered structures consisting of hole multiplication layers 304 and 308, charge layers 303 and 307, and a contact layer 305, between the emitter light absorption layer 302 and the collector layer C. The emitter light absorption layer 302 employs a single bulk-type material layer, and two avalanche-gain layered structures each consisting of a hole multiplication layer and a p-type contact are used. This structure may be obtained by forming a n$^+$-InP emitter layer (top contact layer), a n$^+$ (i)-InGaAs single material light absorption layer thinner than 1 $\mu$m, a n-InGaAsP spacer layer and two avalanche-gain layered structures (consisting of a n-InP multiplication layer thinner than 5000 Å and a p$^+$ InP contact layer).

Figure 4:
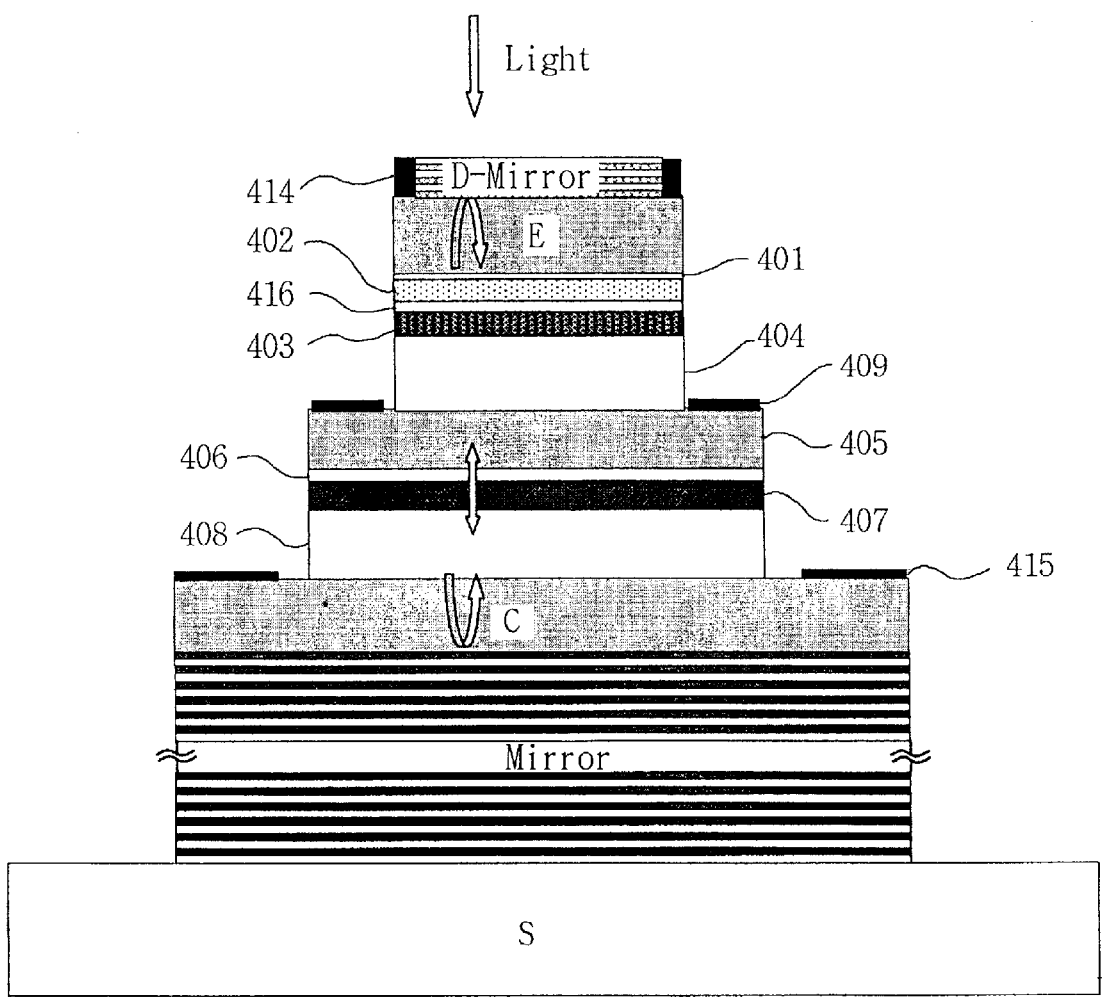
FIG. 4 is a lateral cross-sectional view of a resonant-cavity multiple-avalanche process photodetector using a resonant cavity structure according to a fourth embodiment of the present invention.

The avalanche photodetector shown in FIG. 4 is formed by using two avalanche-gain layered structures consisting of high-speed resonant-cavity multiple charge layers 403 and 407, electron multiplication layers 404 and 408, and a contact layer 405. The avalanche photodetector includes an underlying mirror structure of a semiconductor quarter-wave ($\lambda$/4) stack located between the collector layer and the substrate. Also, the resonant-cavity avalanche photodetector includes an upper mirror structure using a dielectric multilayer over the emitter (E) layer. Thus, the avalanche photodetector may achieve a high-speed operation and high-gain characteristic.

Also, the emitter light absorption layer 402 may be formed by using one of a bulk-type layer, a self-assembled quantum dot structure, a vertical-type quantum dot array or quantum wire array structure formed by utilizing a quantum well structure.

For example, the resonant cavity multiple-avalanche photodetector may be formed of a stacked structure of a p$^+$-InAlAs emitter layer (top contact layer), an i-InAlAs spacer layer, an i-InGaAs thin film light absorption layer of below 0.1 $\mu$m, an i-InGaAlAs graded layer (InGa$_{0.47(1-x)}$Al$_{0.47x}$As, x=1–>0) and a [multiple] plurality of avalanche-gain layered structures (a gain layer consisting of a p-InAlAs charge layer thinner than 1000 Å, an i-InAlAs multiplication layer thinner than 2000 Å and a n$^+$ contact layer thinner than 2000 Å); an underlying mirror structure of a semiconductor quarter-wave ($\lambda$/4) stack made of InAlAs/InAlGaAs located between the collector layer and the substrate; and a upper mirror structure formed by ZnSe/MgF$_2$ multiple dielectric layers on the emitter layer (top contact layer). Also, the spacer layers 401, 406 and 416 serve to control the impurity diffusion.

Figure 5A:
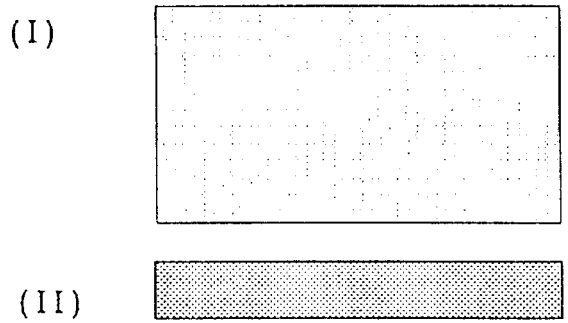
FIG. 5a and FIG. 5b are lateral and planar cross-sectional views of an emitter light absorption layer according to one embodiment of the present invention, wherein FIGS. 5a(I) and (II) are lateral and planar cross-sectional views of the emitter light absorption layer formed of a bulk layer or a thin film of a single material, and FIGS. 5b(I) and (II) are schematic diagrams of a self-assembled quantum dot arrays having single layer structure or laminated layer structure.
Figure 5B:
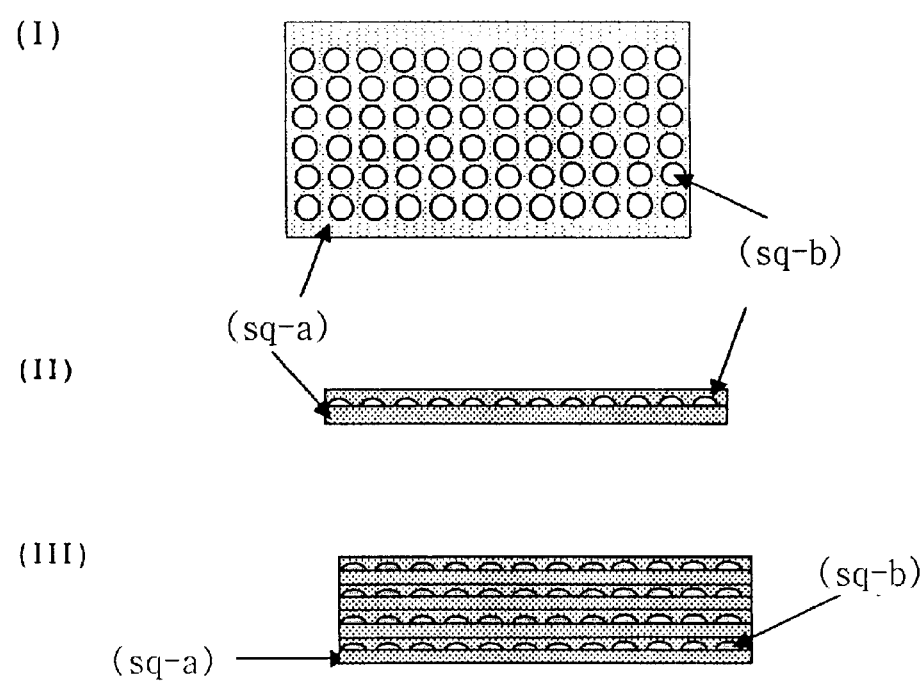

Referring now to FIG. 5a and FIG. 5b, an emitter light absorption layer according to one embodiment of the present invention will be below explained in detail.

FIGS. 5a(I) and (II) are planar and lateral cross-sectional views of the emitter light absorption layer made of a single bulk-type material layer or a thin film, and FIGS. 5b(I) is a planar cross-sectional view of a self-assembled quantum dot array and 5b(II) and (III) are lateral cross-sectional views of a single layer structure and a stacked structure of a self-assembled quantum dot array. For example, (sq-a) is a GaAs layer and (sq-b) is an InAs quantum dot.

Figure 5C:
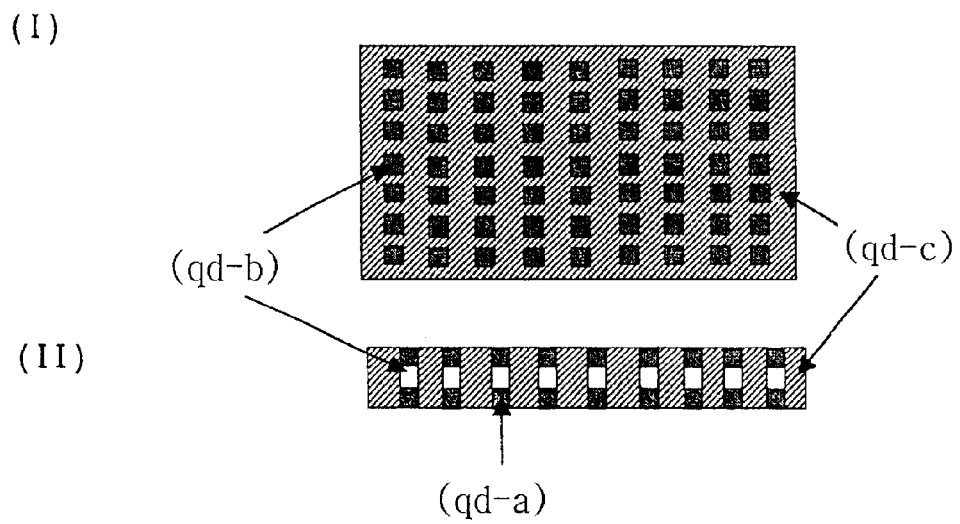
FIGS. 5c(I) and (II) are diagrams showing the quantum dot array structure which is formed by a lateral confinement process in a double barrier quantum well structure.

FIGS. 5c(I) and (II) show the planar and lateral cross-sectional view of the light absorption layer structure where a quantum dot array structure is formed by a further confinement process in a double-barrier quantum-well type epitaxial structure. For example, (qd-a) is an InAlAs layer, (gd-b) is a quantum dot structure using an InGaAs quantum well layer having a thickness below 100 Å and (qd-c) is an insulating layer.

Figure 5D:
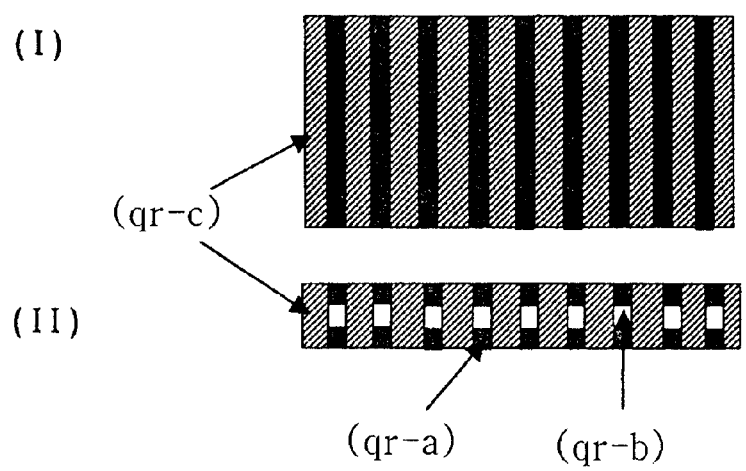
FIGS. 5d(I) and (II) are lateral and planar cross-sectional views of the light absorption layer structure of an emitter having a vertical quantum wire array structure using a double barrier quantum well structure.

FIGS. 5d(I) and (II) are planar and lateral cross-sectional views of a vertical quantum dot array structure layer using a double barrier quantum well structure for the emitter light absorption layer structure. For example, (qr-a) is an i-InAlAs barrier layer, (qr-b) is a quantum wire structure obtained by using an InGaAs quantum well layer and (qr-c) is an insulating layer.

Figure 5E:
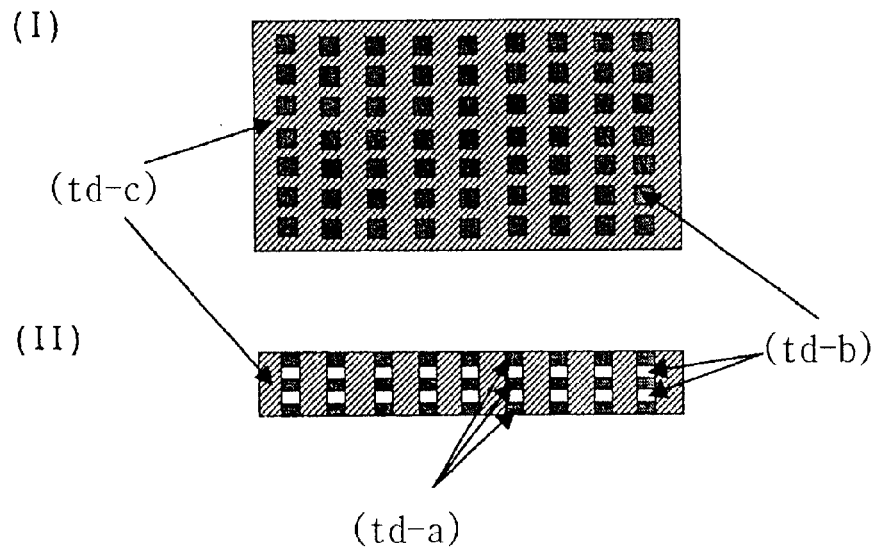
FIGS. 5e(I) and (II) are lateral and planar cross-sectional views of the light absorption layer structure of an emitter having a vertical quantum dot array structure using a triple-barrier double quantum-well structure.

FIGS. 5e(I) and (II) are planar and lateral cross-sectional views of a vertical quantum dot array structure layer using a triple-barrier double quantum-well structure for the emitter light absorption layer structure. For example, (td-a) is an i-InAlAs barrier layer, (td-b) is a quantum dot structure using an InGaAs quantum well layer, and (td-c) is an insulating layer.

Figure 5F:
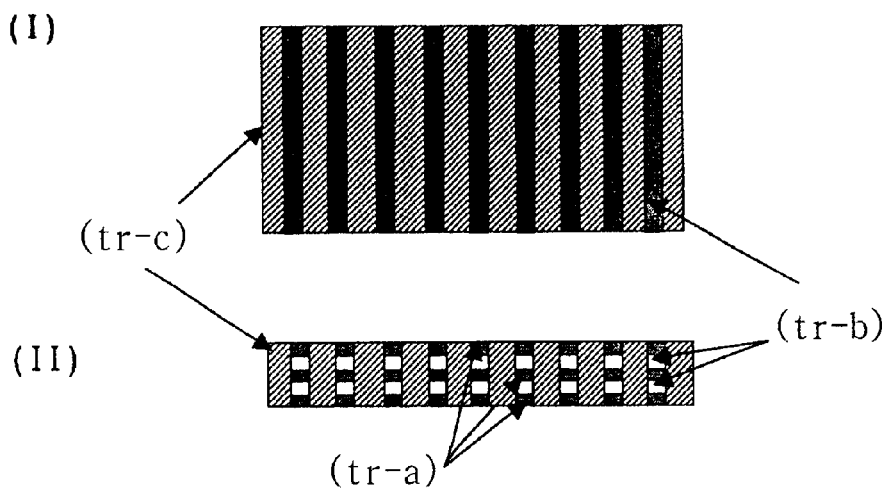
FIGS. 5f(I) and (II) are diagrams showing a quantum wire array structure formed using a triple-barrier quantum-well epitaxial structure.

FIGS. 5f(I) and (II) show quantum dot array structures where quantum dot array is formed by planar confinement process in a three-barrier quantum well-type epitaxial structure. For example, (tr-a) is an i-InAlAs barrier layer, (tr-b) is a quantum wire structure thinner than 100 Å obtained by using a InGaAs quantum well layer, and (tr-c) is an insulating layer.

Figure 6A:
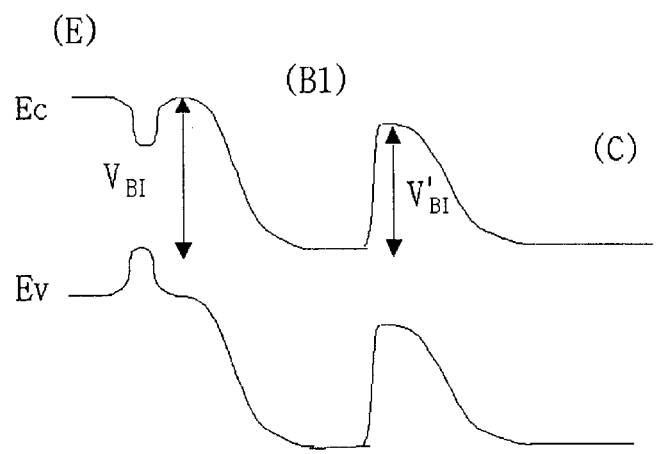
Figure 6B:
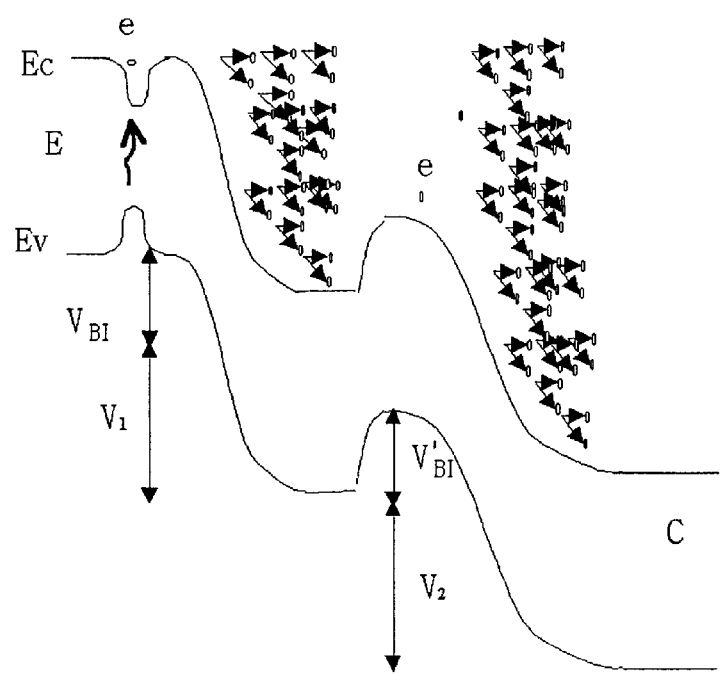

FIG. 6a and FIG. 6b are the energy band diagrams showing the energy states within respective layers when a voltage is applied in the three-terminal photodetector having two avalanche-gain layered structures shown in FIG. 1.

Referring now to FIG. 6a and 6b, the energy band diagrams obtained when voltage is not applied (i.e., thermal equilibrium state) and when an external voltage is applied, respectively, will be explained below in detail.

An interband transition of electrons within the light absorption layer into the conduction band occurs due to absorption of infrared-ray. The transited electrons reach the collector through two avalanche-gain layered structures in the presence of the voltage applied externally and a built-in potential (internal voltage or a contact potential: VBI) within the device. At this time, $V_{BI}$ is a built-in potential in the first avalanche-gain layered structure and $V'_{B1}$ is a built-in potential in the second avalanche-gain layered structure, respectively.

The magnitude of electric field in each of the avalanche-gain layered structures is controlled by the voltage applied to both ends of each of the gain layers. $V_1$ is the voltage applied between the cathode (emitter) and the B1 (electrode of the contact layer 105) and $V_2$ is a voltage applied between the B1 and the collector. At his time, $V_1$ and $V_2$ have opposite polarities. That is, in the multiplication structure using electrons, $V_1$ becomes a negative bias voltage and $V_2$ becomes a positive bias voltage. Thus, carriers are amplified through the multiplication layers and reach the collector, so that the electric signal is amplified.

Figure 7A:
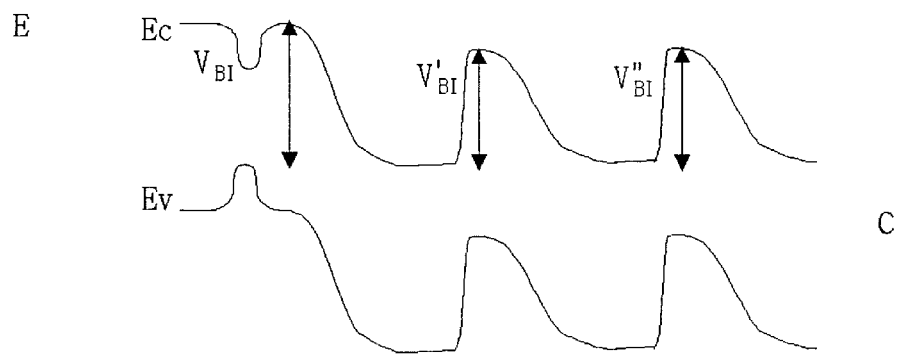
Figure 7B:
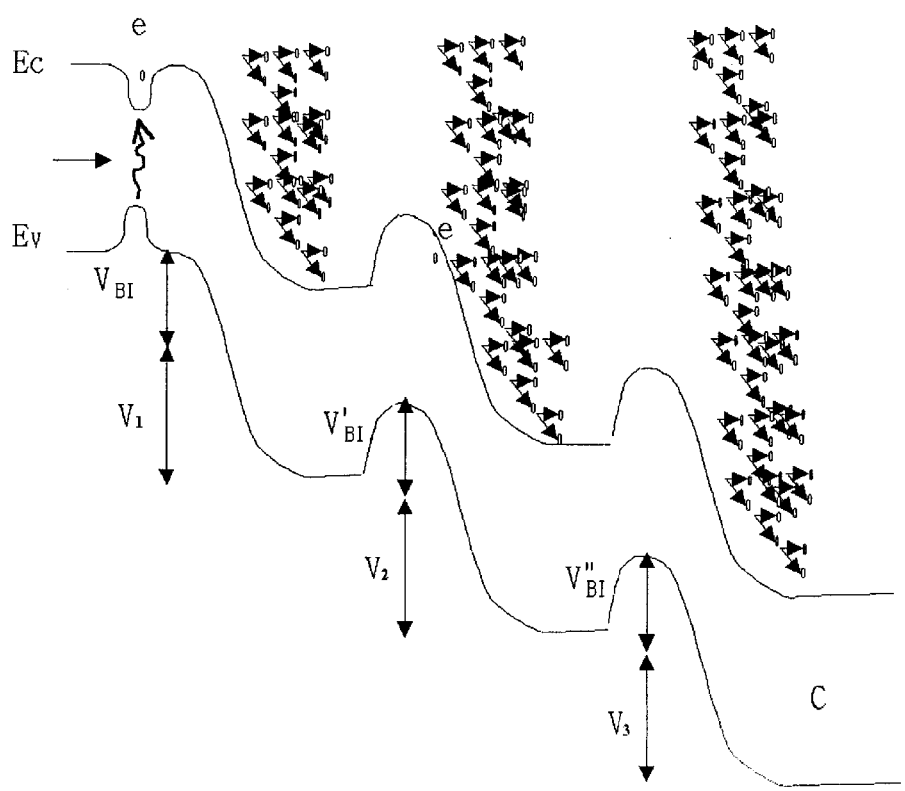

FIG. 7a and FIG. 7b are the energy band diagrams showing the energy states within respective layers when a voltage is applied in the four-terminal photodetector having three avalanche-gain layered structures shown in FIG. 2.

Referring now to FIG. 7a and FIG. 7b, energy band diagrams obtained when voltage is not applied (i.e., thermal equilibrium state) and when an external voltage is applied, respectively, will be explained below in detail.

An interband transition of electrons within the light absorption layer into the conduction band occurs due to absorption of infrared-ray. The transited electrons reach the collector through three avalanche-gain layered structures in the presence of the voltage applied externally and a built-in potential within the device. Here, $V_{B1}$ is a built-in potential in the first avalanche-gain layered structure, $V'_{B1}$ is a built-in potential in the second avalanche-gain layered structure and $V''_{B1}$ is a built-in potential in the third avalanche-gain layered structure, respectively.

At this time, the magnitude of electric field in each of the avalanche-gain layered structures is controlled by the voltages applied to both ends of each of the gain layers. $V_1$ is a voltage applied between the cathode (emitter) and the B1 (electrode of the contact layer 205), $V_2$ is a voltage applied between B1 and B2 (the electrode of the contact layer 210) and $V_3$ is a voltage applied between the B2 and the collector. At this time, $V_1$ and an opposite polarity with respect to $V_2$ and $V_3$. That is, in case of a multiplication structure using electrons, $V_1$ becomes a negative bias voltage, and $V_2$ and $V_3$ each become positive bias voltages. Thus, carriers are amplified through the multiplication layers and reach the collector, so that the electric signal is amplified.

Figure 8A:
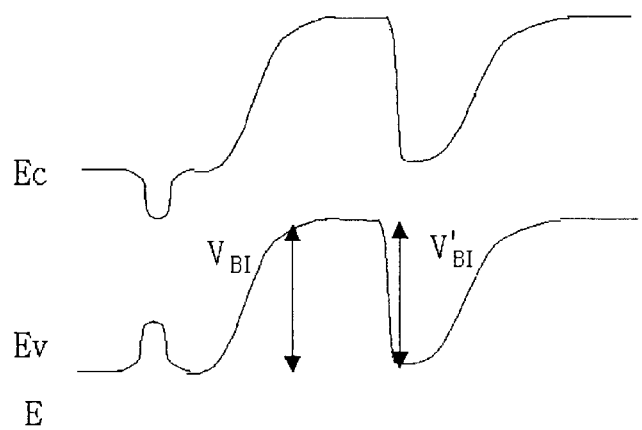
Figure 8B:
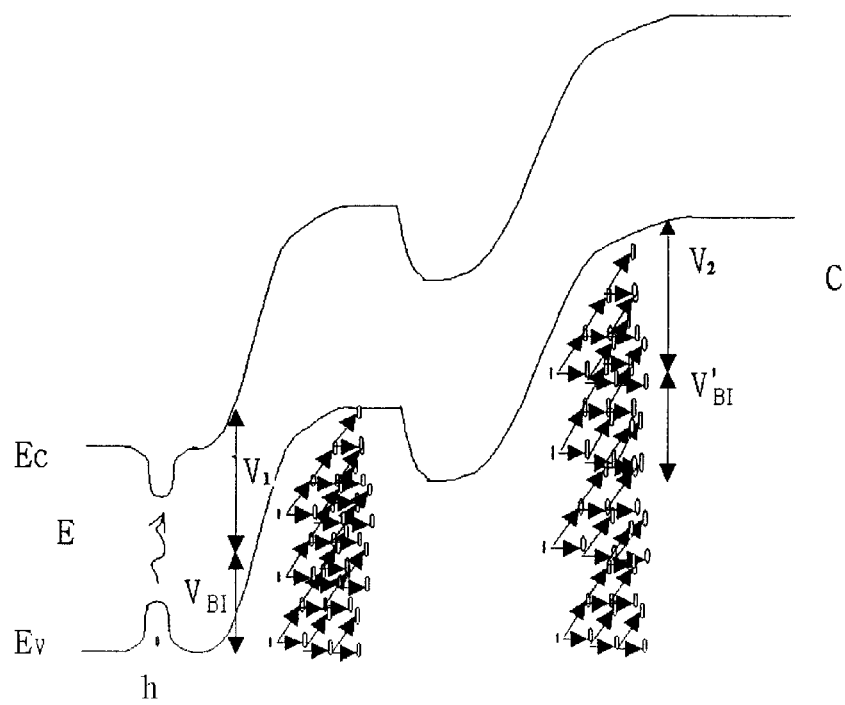

FIG. 8a and FIG. 8b are the energy band diagrams showing the energy states within respective layers when a voltage is applied in the planar-type three-terminal avalanche photodetector using two avalanche-gain layered structures shown in FIG. 3.

Referring now to FIG. 8a and FIG. 8b, energy band diagrams obtained when voltage is applied (i.e., thermal equilibrium state) and when an external voltage is applied, respectively, will be explained below in detail.

An interband transition of electrons within the light absorption layer into the conduction band occurs due to infrared-ray absorption, thus leaving holes in the valence band. The generated holes reach the collector through two avalanche-gain layered structures in the presence of the voltage applied externally and a built-in potential within the device. At this time, the magnitude of electric field in each of the avalanche-gain layered structures is controlled by the voltages applied to both ends of each of the gain layers. $V_1$ is a voltage applied between the emitter and the B1 (electrode of the contact layer 305), $V_2$ is a voltage applied between B1 and the collector. At this time, $V_1$, and $V_2$ have opposite polarities to each other. That is, in case of a structure using holes, $V_1$ becomes a positive bias voltage, and $V_2$ becomes a negative bias voltage. Thus, carriers are amplified through the multiplication layers and reach the collector, so that the electric signal is amplified.

Figure 9A:
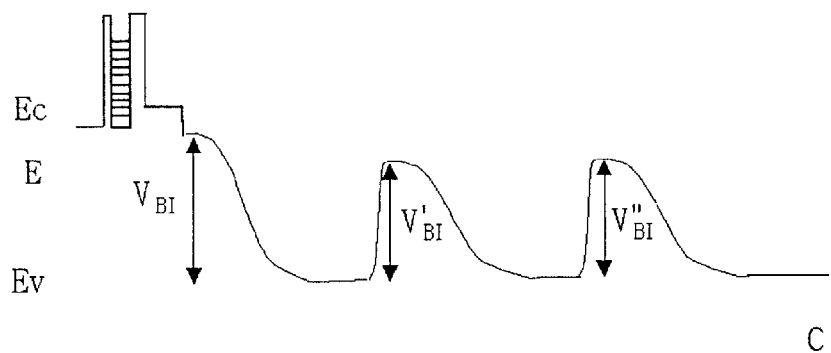
FIG. 9a shows an energy band diagram when voltage is not applied (i.e., thermal equilibrium state)
Figure 9B:
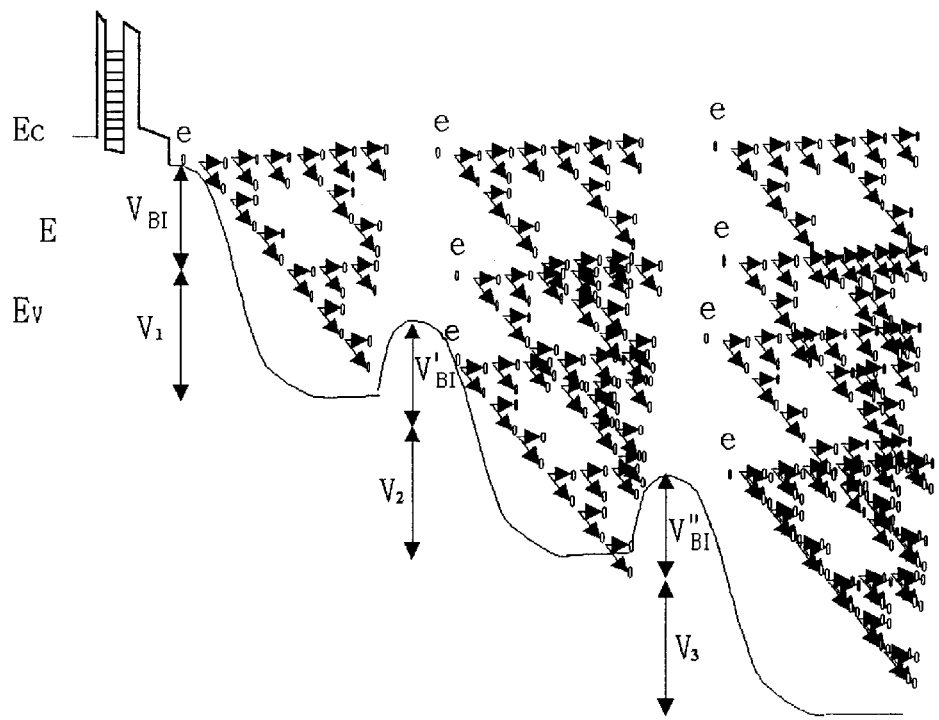
FIG. 9b shows an energy band diagram when an external voltage is applied thereto.

FIG. 9a and FIG. 9b are the energy band diagrams showing the energy states within respective layers when a voltage is applied, in the resonant-cavity multiple-avalanche process four-terminal photodetector using an intersubband transition of electron having three avalanche-gain layered structures in the photodetector shown in FIG. 4.

Referring now to FIG. 9a and FIG. 9b, energy band diagrams obtained when voltage is not applied (i.e., thermal equilibrium state) and when an external voltage is applied, respectively, will be explained below in detail.

The emitter light absorption layer has a structure adopting a quantum dot structure, a quantum well structure or a quantum wire structure. Electrons within the quantum light absorption layer are sharply transited into an excited state by means of infrared-ray absorption. The absorption wavelength is determined by the size of quantum dot or by the width of the quantum well or the width of the quantum wire.

Electrons within the quantum light absorption layer are sharply transited into an excited level by means of infrared-ray absorption. At this time, the electrons transited into the excited level reach the collector through the blocking barrier, the charge layer and the multiplication layer in the presence of an externally applied voltage and a built-in potential within the device. Here, the mirror structures are introduced to form a resonant cavity. Thus, the quantum efficiency and the performance of the device is improved, which thus allows high speed operation of the infrared-ray signal detector. The infrared-ray absorption wavelength is determined by the confined energy level of electron at the quantum dot, the quantum well or the quantum wire.

As mentioned above, the present invention uses two or more avalanche-gain layered structures and multi-terminals in the photodetector. Therefore, the present invention has advantages of enhancing the sensitivity, gain, operation speed and stability of the device and lowering the operation voltage. Also, the present invention can compensate for a low light absorption resulting from a thin absorption layer by accomplishing a high gain obtained by the multiple avalanche process, and by using a low voltage it may contribute to improve the stability of the device with a lower breakdown voltage.

Also, the present invention provides multiple new functionality to the device by utilizing multi-terminals by which one can select and process infrared-ray signals with various wavelength using increased degree of freedom controlling the applied voltages. In addition, the present invention can be used for the applications requiring a very high sensitivity such as long-distance communication, single photon counting, etc. As the device of the present invention may perform the function of a preamplifier due to its high gain, the present invention may be applied to a high-speed photodetector, a high-speed infrared-ray signal detector and an amplifier. In addition, the present invention can be applied to ultra-high speed switching and digital logics, high-speed infrared-ray logic devices having multiple functions because of its increased degree of freedom secured by adopting three or more terminals.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. An avalanche photodetector with multi-terminals comprising:
   an emitter light absorption layer absorbing input radiation and located between a collector layer and an emitter layer (top contact layer) sequentially formed on a substrate;
   a plurality of avalanche-gain layered structures including a multiplication layer having a maximum thickness of 5000 Å and amplifying the absorbed input radiation, a charge layer having a maximum thickness of 1000 Å and controlling a built-in potential and electric field of said multiplication layer, and a contact layer located between said emitter light absorption layer and said collector layer.

2. The avalanche photodetector according to claim 1, wherein said emitter light absorption layer is formed of any one of a single bulk-type material layer, a thin material film, a self-assembled quantum dot structure layer, and a vertical-type quantum dot array structure or quantum wire array structure formed by a double or multiple barrier quantum well structure.

3. The avalanche photodetector according to claim 1, wherein said multiplication layer is formed of a superlattice.

4. The avalanche photodetector according to claim 1, wherein said plurality of avalanche-gain layered structures further include a spacer layer for controlling an impurity diffusion between said charge layer and said contact layer.

5. The avalanche photodetector according to claim 1, further comprising a spacer layer for controlling an impurity diffusion between said light absorption layer and said emitter layer (top contact layer).

6. An avalanche photodetector including an emitter light absorption layer structure absorbing input radiation and located between a collector layer and an emitter layer (top contact layer) sequentially formed on a substrate, comprising:
   a first avalanche-gain layered structure including a first multiplication layer having a maximum thickness of 5000 Å for amplifying the absorbed input radiation and being formed on said collector layer, a first charge layer having a maximum thickness of 1000 Å for controlling a built-in potential and electric field of said first multiplication layer and being formed on said first multiplication layer, and a contact layer formed on said first charge layer; and
   a second avalanche-gain layered structure including a second multiplication layer having a maximum thickness of 5000 Å for amplifying the absorbed input radiation and being formed on said first avalanche-gain layered structure, and a second charge layer having a maximum thickness of 1000 Å for controlling a built-in potential and electric field of said second multiplication layer and the emitter light absorption layer and being formed on said second multiplication layer,
   wherein said emitter light absorption layer is stacked on said second avalanche-gain layered structure.

7. The avalanche photodetector according to claim 6, further comprising a spacer layer for controlling an impurity diffusion between said light absorption layer and said second avalanche-gain layered structure.

8. An avalanche photodetector including an emitter light absorption layer structure absorbing input radiation and located between a collector layer and an emitter layer (top contact layer) sequentially stacked on a substrate, comprising:
   a first avalanche-gain layered structure including a first multiplication layer having a maximum thickness of 5000 Å for amplifying the absorbed input radiation and being formed on said collector layer, a first charge layer having a maximum thickness of 1000 Å for controlling a built-in potential and electric field of said first multiplication layer and being formed on said first multiplication layer and a contact layer formed on said charge layer;
   a second avalanche-gain layered structure including a second multiplication layer having a maximum thickness of 5000 Å for amplifying the absorbed input radiation and being formed on said first avalanche-gain layered structure, a second charge layer having a maximum thickness of 1000 Å for controlling a built-in potential and electric field of said second multiplication layer and being formed on said second multiplication layer, and a contact formed on said second charge layer; and
   a third avalanche-gain layered structure including a third multiplication layer having a maximum thickness of 5000 Å for amplifying the absorbed input radiation and being formed on said second avalanche-gain layered structure, and a third charge layer having a maximum thickness of 1000 Å for controlling a built-in potential and electric field of said third multiplication layer and the emitter light absorption layer and being formed on said third multiplication layer, wherein said emitter light absorption layer structure is stacked on said third avalanche-gain layered structure.

9. The avalanche photodetector according to claim 6, wherein said emitter light absorption layer is formed of any one of a single bulk-type material layer, a thin material film, a self-assembled quantum dot structure layer, and a vertical-type quantum dot array structure or quantum wire array structure formed by a double or multiple barrier quantum well structure.

10. The avalanche photodetector according to claim 6, wherein said first multiplication layer and said second multiplication layer are formed of a superlattice.

11. The avalanche photodetector according to claim 6, wherein said first avalanche-gain layered structure further comprises a spacer layer for controlling an impurity diffusion between said first charge layer and said contact layer.

12. The avalanche photodetector according to claim 8, further comprising a spacer layer for controlling an impurity diffusion between said emitter light absorption layer and said third avalanche-gain layered structure.

13. A resonant cavity avalanche photodetector including an emitter light absorption layer absorbing input radiation between a collector layer and an emitter layer (top contact layer) sequentially formed on a substrate, an underlying mirror structure formed between said substrate and said collector layer, and an upper mirror structure formed on said emitter layer (top contact layer), comprising:

a plurality of avalanche-gain layered structures including a multiplication layer having a maximum thickness of 5000 Å for amplifying the absorbed input radiation, a charge layer having a maximum thickness of 1000 Å for controlling a built-in potential and electric field of said multiplication layer, and a contact layer located between said emitter light absorption layer and said collector layer.

14. The resonant cavity avalanche photodetector according to claim 13, wherein said plurality of avalanche-gain layered structures comprises:

a first avalanche-gain layered structure having a first multiplication layer formed on said collector layer, a first charge layer formed on said first multiplication layer and a contact layer formed on said first charge layer; and a second avalanche-gain layered structure having a second multiplication layer formed on said first avalanche-gain layered structure and a second charge layer formed on said second multiplication layer.

15. The resonant cavity avalanche photodetector according to claim 13, wherein said emitter light absorption layer is formed of any one of a single bulk-type material layer, a thin material film, a self-assembled quantum dot structure layer, and a vertical-type quantum dot array structure or quantum wire array structure formed by a double or multiple barrier quantum well structure.

16. The resonant cavity avalanche photodetector according to claim 13, wherein said multiplication layer is formed of a superlattice.

17. The resonant cavity avalanche photodetector according to claim 13, wherein said plurality of avalanche-gain layered structures further include a spacer layer for controlling an impurity diffusion between said charge layer and said contact layer.

18. The resonant cavity avalanche photodetector according to claim 13, further comprising a spacer layer for controlling an impurity diffusion between said emitter light absorption layer and said emitter layer (top contact layer).

* * * * *